United States Patent [19]

Fette

[11] Patent Number: 4,852,179
[45] Date of Patent: Jul. 25, 1989

[54] VARIABLE FRAME RATE, FIXED BIT RATE VOCODING METHOD

[75] Inventor: Bruce A. Fette, Mesa, Ariz.

[73] Assignee: Motorola, Inc., Schaumburg, Ill.

[21] Appl. No.: 104,698

[22] Filed: Oct. 5, 1987

[51] Int. Cl.$^4$ ............................................. G10L 5/00
[52] U.S. Cl. ...................................... 381/29; 381/51; 364/513.5
[58] Field of Search .................................. 381/29–53; 364/513.5

[56] References Cited

U.S. PATENT DOCUMENTS 4,701,955 10/1987 Taguchi ................................. 381/51

OTHER PUBLICATIONS

"The Application of a Functional Perceptual Model of Speech to Variable-Rate LPC System", Viswanathan et al., IEEE, A.S.S.P. Conference, 1977, pp. 219–222.
"Vector Quantization in Speech Coding", Makhoul et al., Proceedings of the IEEE, vol. 73, No. 11, Nov. 1985, pp. 1551–1588.
"Vector Quantization: A Pattern-Matching Technique for Speech Coding", Gevsho et al., Proceedings of the IEEE, Dec. 1983, pp. 87–105.

Primary Examiner—Patrick R. Salce
Assistant Examiner—Emanuel Todd Voeltz
Attorney, Agent, or Firm—Frank J. Bogacz

[57] ABSTRACT

A method of operating a vocoder so that a variable frame rate results while maintaining a constant bit rate is disclosed. A base frame rate remains constant. However, spectral change is measured to determine an appropriate subframe rate within the base frame. Only one of a plurality of separate vector quantization processes is selected in response to spectral change for performance of a vector quantization operation on LPC spectrum coefficients. Each of the plurality of vector quantization operations utilizes its own codebook that contains a different quantity of reference patterns from that contained in the other codebooks. Each vector quantization operation produces a reference pattern descriptor code that contains a different number of bits from that produced by the other vector quantization processes. Vector quantization operations producing smaller, less spectrally accurate outputs are selected when more subframes are included with a base frame, and vector quantization operations producing larger, more spectrally accurate outputs are selected when fewer subframes are included within a base frame.

16 Claims, 3 Drawing Sheets

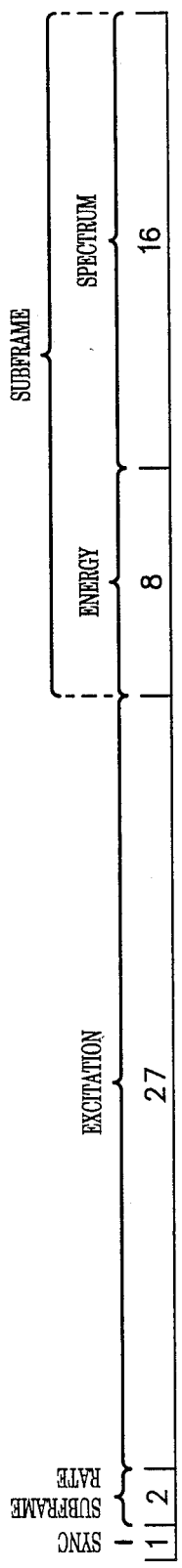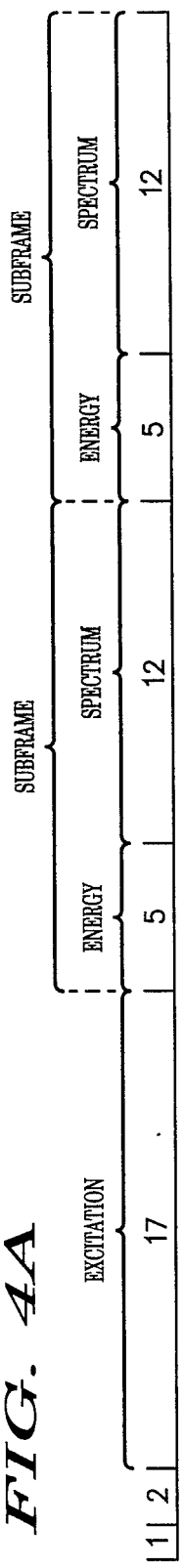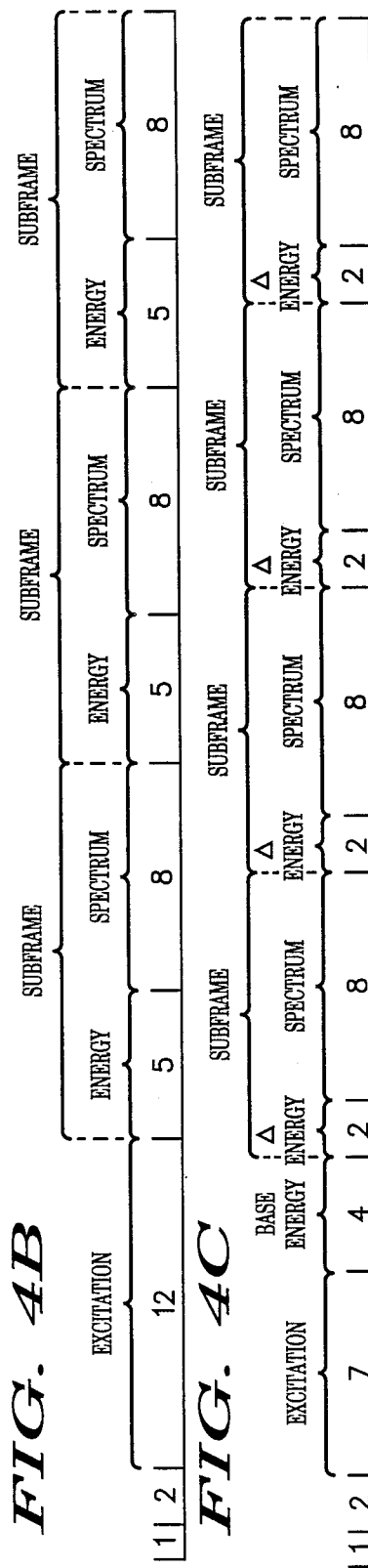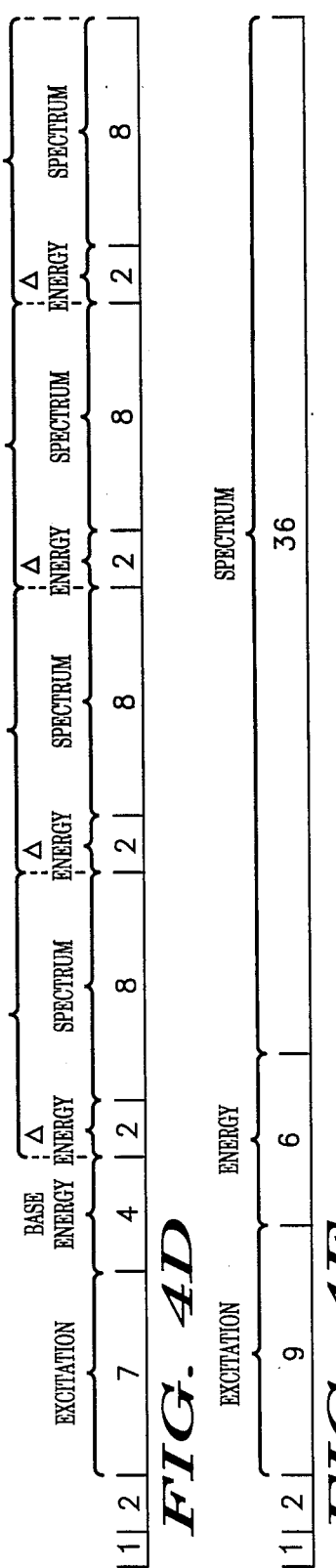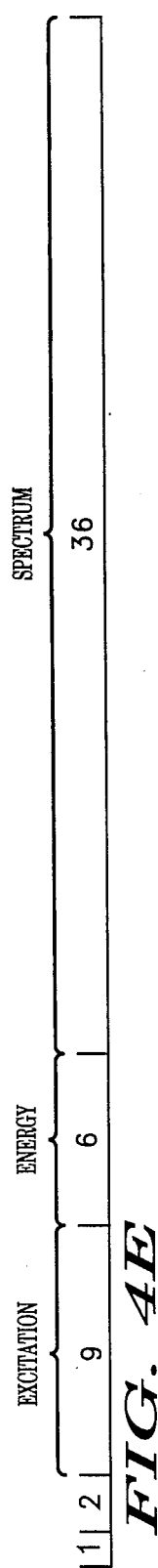

VARIABLE FRAME RATE, FIXED BIT RATE VOCODING METHOD

BACKGROUND OF THE INVENTION

The present invention relates generally to vocoders and methods of operating vocoders. For purposes of the present invention, vocoders receive digitized samples of an analog voice signal and compress or encode the samples so that a resulting code characterizes the analog voice signal. The resulting code may then be applied to a channel, such as a transmission channel or a storage device. Such channels typically have a bandwidth which accommodates the resulting code, but is too low to accommodate the digitized samples. The resulting code, characterizes the original analog voice signal so that it may be decoded or expanded by a vocoder to produce samples that reproduce the voice signal as perceptually accurately as possible. The present invention relates to vocoders which seek to achieve optimal voice quality in the reproduced voice signal for a given bit rate. Specifically, the present invention relates to vocoders which utilize a variable frame rate in the compression or encoding operations.

Voice represents a complicated analog signal which is not easily compressed so that an accurate reproduction will result. For example, vowel sounds require a relatively long analysis window so that a relatively high degree of spectral accuracy can be achieved. The relatively high degree of spectral accuracy is required so that a later synthesized vowel sound will appear to accurately reproduce the original analog voice signal to a listener. On the other hand, consonant sounds require a relatively short analysis window so that a relatively high degree of temporal resolution may be achieved. The high degree of temporal resolution is required so that a later synthesized consonant sound will appear as an accurate reproduction of the original voice signal to a listener.

FIG. 1 shows the relationship between spectral accuracy and temporal resolution. Generally speaking, at a given bit rate a vocoder can achieve a high spectral accuracy by sacrificing temporal resolution, or can achieve a high degree of temporal resolution by sacrificing spectral accuracy.

Many conventional vocoders which apply coded voice to a fixed rate channel do not vary frame rate. Accordingly, designs of such systems attempt to trade off temporal resolution, which is needed to achieve accurate reproduction of consonants, with spectral accurate, which is needed to achieve accurate reproduction of vowels, and vice versa. Consequently, noticeably inaccurate reproductions for both vowels and consonants results. Reproduced consonants become slightly slurred and vowels do not faithfully reproduce nasal perceptions and voiced fricative perceptions.

A conventional solution to the problem of noticeably inaccurate reproductions of vowel and consonant sounds varies the analysis window, or frame, over which samples are coded so that short frames are used for analysis of consonants and long frames are used for analysis of vowels. However, a cumbersome vocoder architecture results from conventional implementations which adapt such variable frame rate vocoding methods for use with fixed rate channels. Such conventional implementations typically require elaborate buffering schemes with feedback systems to maintain a constant bit rate in spite of the variable frame rate. In some conventional systems, the buffering introduces an unacceptable delay.

SUMMARY OF THE INVENTION

Accordingly, it is an object of the present invention to provide an improved vocoding method which may be implemented using a wide variety of vocoder architectures and which permits variable frame rates at constant bit rates without the use of significant buffering or feedback schemes.

Another object of the present invention concerns providing an improved vocoding method that utilizes a base frame that occurs at a constant rate but contains a variable number of subframes depending upon whether a voice signal being analyzed resembles a vowel sound or a consonant sound.

The above and other objects and advantages of the present invention are carried out in one form by a method of operating a vocoder to compress voice data samples. The method first selects a particular one of a plurality of possible subframe rates. Subsequently, an analyzing step operates on at least a portion of the voice data samples to produce a predictive code which represents the analyzed samples. Additionally, a quantizing step transforms the predictive code into a quantized code wherein the bit length of the quantized code is defined by the selected subframe rate and a bit rate parameter of a fixed rate channel into which the quantized code is applied.

BRIEF DESCRIPTION OF THE DRAWINGS

A more complete understanding of the present invention may be derived by reference to the detailed description and claims when considered in connection with the accompanying drawings, wherein like reference numbers indicate like features throughout the drawings, and wherein;

FIGS. 4A through 4F show exemplary definitions of various fields within a base frame of data output by the vocoder of FIG. 2.

DETAILED DESCRIPTION OF THE PREFERRED EMBODIMENT

Figure 1:
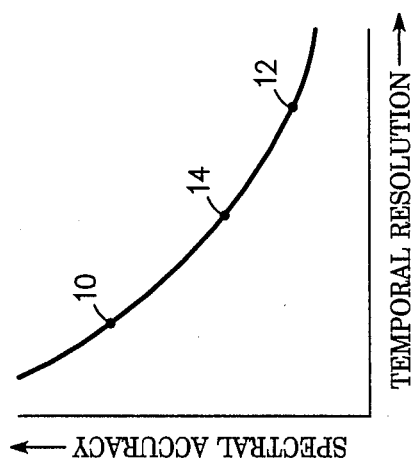
FIG. 1 shows a rate distortion boundary curve.

FIG. 1 shows a rate-distortion boundary curve for applying encoded voice signals to a fixed rate channel. It represents a monotonic, decreasing, convex curve. The present invention causes a vocoder (discussed below) to operate at a plurality of points on this rate-distortion boundary rather than at only one point. However, during any one base frame, the present invention operates at only one point. Accordingly, the present invention selects only one of a plurality of points on this rate-distortion boundary at which to operate. This selection occurs once during each base frame.

A point 10 shown in FIG. 1 represents a situation where a voice signal may be described with relatively high spectral accuracy, but relatively low temporal resolution. This situation is appropriate for encoding vowel sounds. On the other hand, a point 12 causes a code generated by the present invention to exhibit a high temporal resolution, but only a relatively low spectral accuracy. Such a point of operation is appropriate for describing certain consonant sounds. Additionally, a point 14 which resides between points 10 and 12 on the rate-distortion boundary, describes the sound using a moderate degree of temporal resolution and a moderate degree of spectral accuracy.

Figure 2:
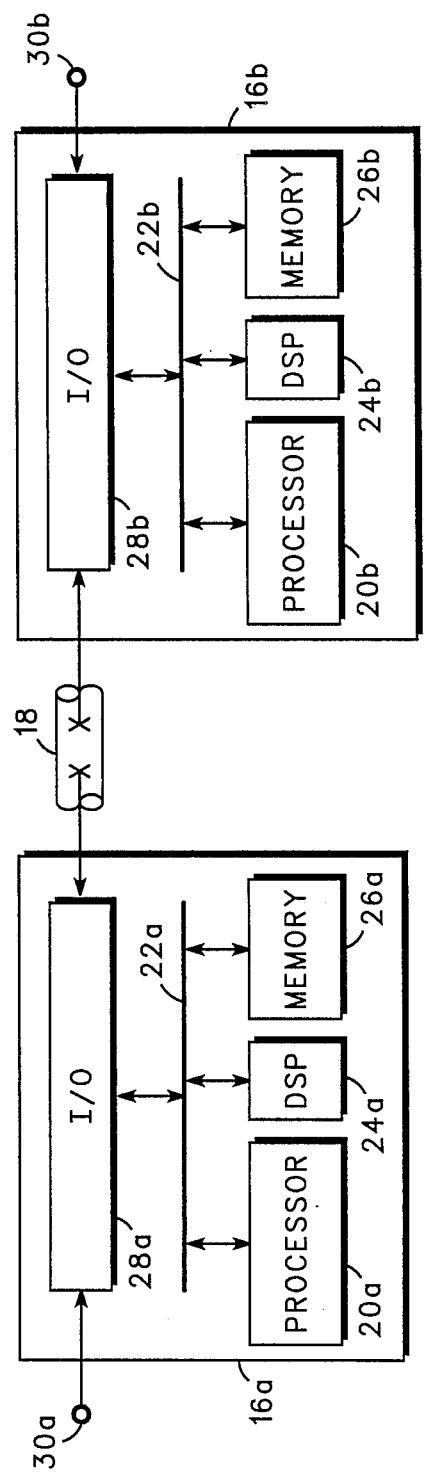
FIG. 2 shows a vocoder architecture utilized in implementing the present invention.

FIG. 2 shows a structure which the present invention utilizes in performing the methods described herein. FIG. 2 shows an analysis vocoder 16a and a synthesis vocoder 16b. As shown in FIG. 2, each of vocoders 16 may be identical in structure. In fact, vocoder 16b may represent vocoder 16a at a later point in time if a fixed rate channel 18 through which an encoded signal is sent represents a memory channel. Conversely, vocoder 16b may represent a different vocoder from vocoder 16a which, having knowledge of the coding scheme utilized by vocoder 16a, may decode and synthesize a signal received from fixed rate channel 18.

Vocoders 16a and 16b each represent computerized signal processing devices. Thus, vocoder 16a has a processor 20a. Processor 20a couples to a computer bus 22a which in turn couples to a digital signal processor 24a, a memory 26a and an input/output (I/O) circuit 28a. I/O circuit 28a has a first I/O port which connects to a terminal 30a. This first I/O port transfers analog signals into and out from vocoder 16a. I/O circuit 28a additionally has a second port which couples to fixed rate channel 18. This second port transfers digitally encoded voice signals into and out from vocoder 16a.

Vocoder 16b has a processor 20b which couples to a computer bus 22b. Computer bus 22b couples to a digital signal processor 24b, a memory 26b and an I/O circuit 28b. I/O circuit 28b has a first port which couples to a terminal 30b. This first I/O port transfers analog signals into and out from vocoder 16b. Additionally, I/O circuit 18b has a second port which couples to fixed rate channel 18. This second port transfers digitally encoded data into and out from vocoder 16b.

Fixed rate channel 18 may represent a memory or storage device for which compression of voice data samples is needed because a quantity of voice data samples occurring within a given period of time would be too great for such memory device or storage. Alternatively, fixed rate channel 18 may represent a transmission channel, such as a telephone line, an RF transmission channel, or the like, which accepts data at a constant rate. The application of data to a telephone line represents one common use of a fixed rate channel.

In operation, analysis vocoder 16a inputs voice data from terminal 30a and digitizes such voice data in I/O circuit 28a. Such digitized samples are generally manipulated and compressed to a point where they may be applied to fixed rate channel 18. Such manipulation and compression occurs primarily through the operation of processor 20a acting upon the digitized samples with the use of digital signal processor 24a and memory 26a.

Synthesizer vocoder 16b performs an inverse operation. Compressed data samples are applied to I/O circuit 28b from fixed rate channel 18. Processor 20b, utilizing digital signal processor 24b and memory 26b, decompresses and expands this compressed data to a point where I/O circuit 28b outputs a multiplicity of voice data samples at terminal 30b. After some analog signal conditioning, the voice data samples output from synthesizer vocoder 16b represent a reproduction of the input voice data.

In the preferred embodiment, analysis vocoder 16a takes 180 samples of analog voice data every 22.5 milliseconds (ms), and outputs data to fixed rate channel 18 at a constant base frame rate of 54 bits every 22.5 milliseconds, or a 2400 bits per second constant rate. Those skilled in the art will recognize that the vocoder architecture described in FIG. 2 and other similar architectures represent general purpose vocoders which are extremely flexible and may be operated to perform many different methods. Furthermore, the methods performed by such vocoders are established to a large degree by the programming which controls processors 20.

Figure 3:
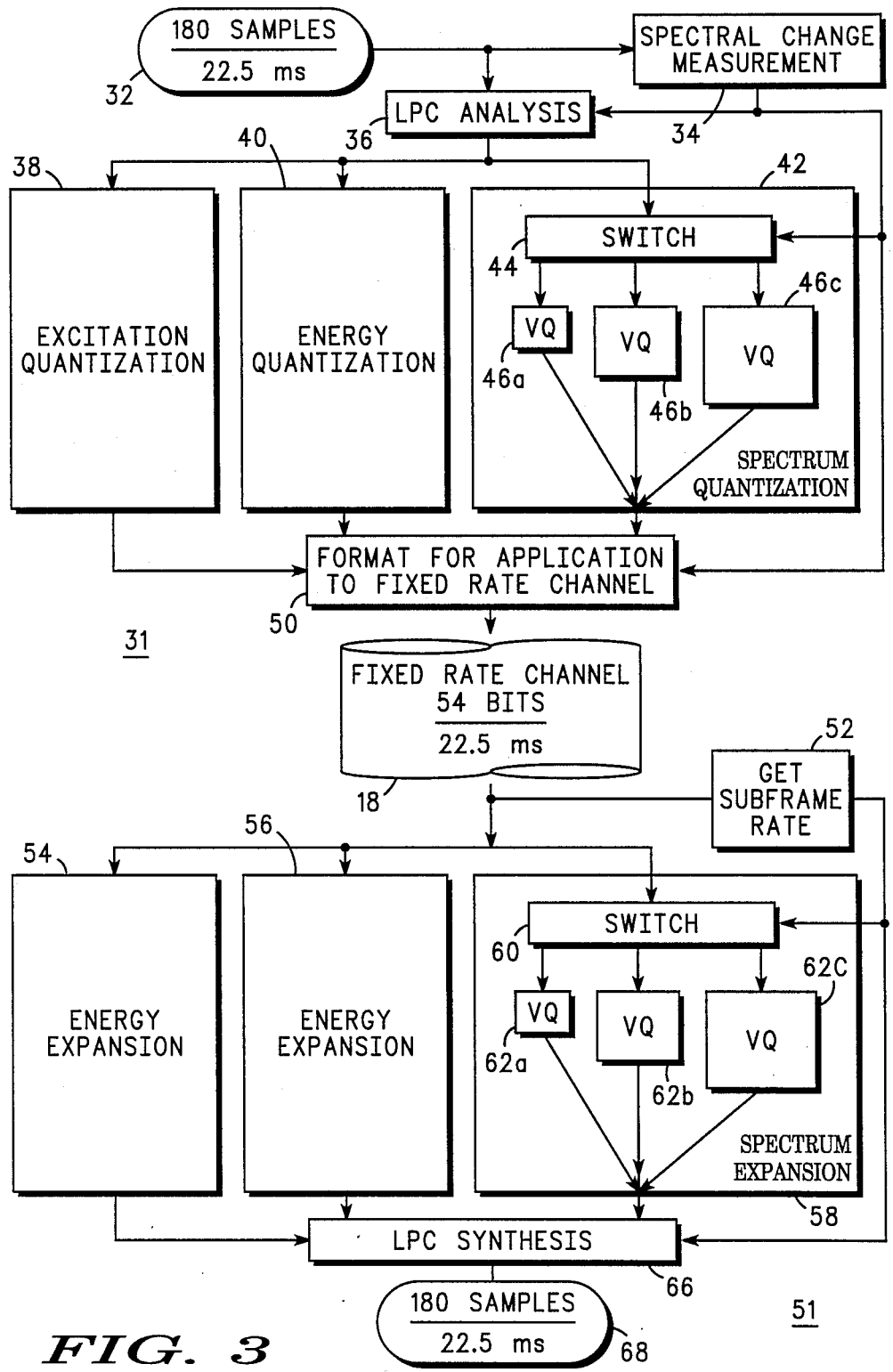
FIG. 3 shows a flow diagram of the present invention.

FIG. 3 describes the operation of vocoders 16 in compressing and expanding voice data. FIG. 3 is divided into an analysis process 31 which is performed prior to application of data to fixed rate channel 18 by vocoder 16a. (see FIG. 2) and a synthesis process 51 which is applied to data obtained from fixed rate channel 18 and is practiced by vocoder 16b. Analysis process 31 starts with the receipt of a multiplicity of voice data samples. In the preferred embodiment, analysis process 31 receives 180 voice data samples every 22.5 milliseconds, as shown in beginning state 32.

The present invention compresses the voice data samples into a base frame of data that exhibits a constant base frame rate. Furthermore, the base frame includes one or more subframes. The base frame will include only one subframe when process 31 analyzes a vowel sound. This situation describes point 10, shown in FIG. 1. In this situation, the vowel sound will be described with a high degree of spectral accuracy, but a low degree of temporal resolution.

Several subframes, a maximum three or four in the preferred embodiment, are utilized to describe consonant sounds. For a consonant sound, the sounds described by each of the subframes within a single base frame exhibit relatively low spectral accuracy. However, due to the quantity of subframes a relatively high temporal resolution results. Thus, such subframes may be characterized as being operations at point 12 in FIG. 1.

From beginning state 32, a spectral change measurement task 34 is performed. Vowel sounds tend to exhibit a relatively constant spectrum over the duration of a base frame. Consonants tend to exhibit a relatively variable spectrum over the duration of a base frame. Accordingly, vowel sounds may be distinguished from consonant sounds by measuring spectral changes. Thus, spectral change measurement process 34 performs a linear predictive coding (LPC) analysis to obtain coefficients useful in making a measurement of spectral change.

However, in order to save computer processing time, the preferred embodiment does not perform a complete LPC analysis to measure spectral change. Since the present invention contemplates only a relatively small number of possible subframe rate choices, only a few spectrum coefficients which tend to influence the spectrum representation most significantly are generated. The preferred embodiment generates only four spectrum coefficients in spectral change measurement process 34. Those skilled in the art will recognize that such coefficients may represent predictor coefficients, or may represent predictor coefficients transformed into reflector coefficients or other coefficient representations such as log area ratios or uniform spectral sensitivities.

Furthermore, spectral change measurement process 34 obtains sets of these few LPC spectrum coefficients for each subframe occurring within a base frame at the maximum subframe rate. For example, if the maximum subframe rate is four subframes per base frame, and the base frame contemplates 180 voice data samples every 22.5 ms, then a first set of spectrum coefficients is obtained for the first 45 of the 180 samples, or the first 5.625 ms of the 22.5 ms base frame. A second set of spectrum coefficients is obtained for the second 45 of the 180 samples, or for the period occurring between 5.625 and 11.25 ms after the start of the base frame. Likewise, a third set of spectrum coefficients is obtained for the third 45 of the 180 samples. This corresponds to the period of time occurring between 11.25 and 16.875 ms after the start of the base frame. Finally, a fourth set of spectrum coefficients is obtained for the fourth 45 of the 180 samples, or for the time period between 16.875 and 22.5 ms after the start of the base frame. If each set of spectrum coefficients consists of 4 coefficients, then a total of 16 coefficients are obtained.

Measurement process 34 next detects the amount of change occurring between each element of the obtained set of coefficients and corresponding elements of a set of coefficients obtained from the immediately previous subframe. Such detection of change may occur through the use of subtraction operations between corresponding elements of successive subframes. These change values are then combined into a single number that may be compared against predetermined thresholds to indicate appropriate subframe rates. Such combining may be accomplished by adding coefficient changes together.

As an example, a resulting combined spectral change number which is greater than a greatest predetermined threshold would suggest that a consonant sound is described by the voice data samples contained in the base frame and that a maximum subframe rate should be utilized throughout the current base frame. Alternatively, if the combined number is less than a least predetermined threshold, then a sound resembling a vowel sound is described by the voice data samples in the base frame, and a minimum subframe rate is appropriate. The minimum subframe rate would typically be one subframe per base frame. If the combined number exhibited a value between the greatest and the least predetermined thresholds, then a medium subframe rate, such as two subframes per base frame, would be appropriate. Alternatively, the spectral change between each subframe may be compared with the threshold, and the number of changes greater than the threshold used as an indication of location on the rate distortion board.

The number of subframes per frame represents the subframe rate and is the output from spectral change measurement process 34. This output increases in value in response to an increase in spectral change. The output from spectral change measurement process 34 is used by several other processes within analysis process 31.

An LPC analysis process utilizes the output from spectral change measurement process 34 in performing a conventional LPC analysis of the voice data samples obtained from state 32. This subframe rate information tells LPC analysis process 36 the number or portion of samples from the base frame to analyze and the number of times such analyses are required for the base frame of 180 data voice samples and the approximate temporal boundary between similar regions. If spectral change measurement process 34 outputs a value of only one subframe per base frame, then only one analysis is required and this analysis utilizes all 180 of the voice data samples. However, if spectral change measurement process 34 outputs a value of 4 subframes per base frame, then 4 separate independent analyses are needed. The first of the 4 LPC analyses utilizes the first 45 of the 180 samples, the second analysis utilizes the second 45 of the 180 voice data samples, the third analysis utilizes the third 45 of the 180 voice data samples and the fourth utilizes the fourth 45 of the 180 voice data samples.

The output from LPC analysis process 36 is a predictive code which includes a set of numbers describing excitation, energy, and spectrum for each analysis performed on the base frame of voice data samples. Those skilled in the art will recognize that a conventional LPC analysis may compress voice data samples into a smaller amount of data than are used to describe the voice data samples. However, additional compression may occur before such information is applied to fixed rate channel 18.

Thus, an excitation quantization process 38 inputs the excitation output from LPC analysis process 36. Excitation quantization process 38 provides additional compression of the excitation information. The present invention contemplates the application of conventional quantization techniques to excitation information 38. Such techniques may introduce a wide variation in the amount of compression achieved. For lower rate channels, excitation information may advantageously be quantized as a single pitch value. Additionally, a predetermined unique code may be established to indicate whether the excitation is voiced or unvoiced. For higher channel rates, the excitation may describe a complex waveform having many different frequency components and phase relationships. The precise quantization process utilized depends upon the number of available bits in an excitation field of a frame of data applied to channel 18 (discussed below). In general, a greater number of bits available within the excitation portion of the frame causes in a more accurate reproduction of an analog voice signal by synthesis process 51. The preferred embodiment of the present invention contemplates utilizing only one excitation for an entire base frame regardless of the number of subframes contained therein. Thus, this excitation information is assumed to remain relatively constant throughout the base frame.

Similarly, an energy quantization process 40 receives energy information from LPC analysis process 36 for quantization. Those skilled in the art will recognize that the energy may also be called gain or amplitude. The present invention contemplates a conventional energy quantization process. In the preferred embodiment of the present invention, a unique energy value is obtained for each subframe within the base frame. Thus, energy quantization process 40 generates a quantity of energy values which depends upon the number of subframes contained within the base frame. The quantity of bits used to described energy values depends upon the size of fields allocated for energy information in a frame of data which is to be applied to channel 18.

A spectrum quantization process 42 utilized by the present invention contemplates the use of vector quantization (VQ) of spectrum information into a quantized code. VQ represents a method of compressing data which takes advantage of linear and non-linear redundancies. An "off-line" process (not shown) that occurs during the design of vocoder 16 (see FIG. 2) populates various codebooks. This populating process derives a set of spectrum coefficients, which may be referred to as reference patterns, code vectors, or templates. The entire set of references patterns within a codebook represents all possible speech spectral sounds. The set is then arranged in a memory device, such as memory 26 (see FIG. 2), to form a codebook, or library, so that an efficient search may be performed in real time to detect which one of all the reference patterns contained in the codebook represents a nearest matching pattern to a particular set of spectrum coefficients which may be produced by the LPC analysis process 36. A pointer, or reference pattern descriptor code, that uniquely identifies the nearest matching reference pattern is then selected as the quantized value and serves as the output from spectrum quantization process 42. Thus, the spectrum coefficients are transformed into reference pattern descriptor codes.

The use of a greater quantity of reference patterns in a codebook permits closer matches between analyzed spectrum coefficients from LPC analysis process 36 and the reference patterns contained within the codebook. Closer matches are desirable because they permit a more accurate spectral representation of the spectral coefficients in the output from spectrum quantization process 42. However, a greater number of reference patterns in a given codebook requires a greater number of bits for description of reference pattern descriptor codes that uniquely define nearest matching reference patterns.

An N bit reference pattern descriptor code can uniquely identify a reference pattern obtained from a codebook having less than $2^N$ reference patterns. For example, if a codebook contains 256 reference patterns, then all possible sounds are characterized as being a set of only 256 sounds. A listener can detect many more than 256 sounds. Thus, much spectral inaccuracy is introduced by using a codebook having only 256 reference patterns. However, the reference pattern descriptor code for such a codebook requires no more than 8-bits to uniquely describe any one of the 256 reference patterns.

On the other hand, if a codebook contains 65,536 reference patterns, then a greater likelihood exists that a given set of spectrum coefficients from LPC analysis process 36 will find a very close match within the reference patterns. As a result, spectral accuracy is greatly improved over the use of a codebook containing only 256 samples. On the other hand, a corresponding reference pattern descriptor code for a codebook containing approximately 65,000 samples requires at least 16 bits for a unique identification of any one of the 65,536 reference patterns.

In the present invention, a switching step 44 chooses only one of a plurality of quantization tasks 46 to operate upon spectrum coefficients generated by LPC analysis process 36. The choice performed by switching step 46 occurs in response to the output from spectral change measurement process 34. A VQ task 46a is selected when the output from spectral change measurement process 34 indicates a maximum rate for subframes within the base frame. VQ task 46a makes a smallest codebook formed in memory 26 (see FIG. 1) available for the VQ operation performed thereby. Consequently, a resulting reference pattern descriptor code output from VQ task 46a may not demonstrate a high degree of spectral accuracy, but contains only a few bits. For example, the codebook utilized by VQ task 46a may contain only 256 reference patterns and VQ task 46a may output an 8-bit reference pattern descriptor code. As discussed above, when the maximum subframe rate is output from spectral change measurement process 34, the base frame of 180 voice data samples is partitioned into subframes and LPC analyses are performed on each of the subframes independently of the other subframes. Likewise, VQ task 46a performs a vector quantization operation for each of the subframes defined by the indicated subframe rate. Consequently, VQ task 46a outputs separate reference pattern descriptor codes for each of the subframes occurring within a base frame at the maximum subfame rate. Each of the reference pattern descriptor codes describes the spectrum for only one of the subframes.

When switching step 44 selects task 46c, and task 46c represents a vector quantization task, a largest codebook contained within memory 26 (see FIG. 2) is made available for a VQ search. A resulting reference pattern descriptor code output from VQ task 46c demonstrates a high degree of spectral accuracy, but also requires a large number of bits. For example, if the codebook utilized by VQ task 46c contains 65,536 reference patterns, then a resulting reference pattern descriptor code would contain at least 16 bits.

When switching step 44 selects VQ task 46b, a medium size codebook formed in memory 26 is used for the VQ operation. Spectral accuracy and bit requirements fall between those outlined above for VQ task 46a and 46c. For example, a codebook containing 4,096 reference patterns may be used, and a resulting reference pattern descriptor code might contain 12 bits.

A task 50 formats or establishes a base frame of data from quantized code output from excitation quantization process 38, energy quantization process 40, and spectrum quantization process 42 for application to fixed rate channel 18. FIGS. 4A–4E show examples of possible predetermined formats that task 50 might utilize in forming the base frame of data. Each of FIGS. 4A–4E describe a base frame containing 54 bits which, in the preferred embodiment, would be applied to channel 18 over 22.5 milliseconds to achieve a 2400 bits per second constant bit rate.

FIG. 4A shows an example of a format for a base frame of data in a single subframe per base frame situation. In this base frame of data, one bit is allocated for a sink bit, and two bits are allocated to describe the subframe rate. The subframe rate bits apply to all subframes in the base frame, which is only one subframe in this example, but permit the use of up to 4 different subframe rates. In the FIG. 4A example, 27 bits of the base frame are allocated to describing the excitation information output from excitation quantization process 38, eight bits are allocated to describing the energy information obtained from energy quantization process 40, and 16 bits are allocated to describing the spectrum information obtained from spectrum quantization process 42.

FIG. 4B shows base frame of data which contains two subframes. In FIG. 4B, one bit has been allocated for synchronization and two bits have been allocated for defining subframe rate as described above in connection with FIG. 4A. Seventeen bits are allocated to describing the excitation. This single excitation information field is utilized in connection with each of the two subframes within the base frame of data. Each of the two subframes allocate 5 bits to describing energy for that particular subframe and 12 bits for describing the spectrum for that particular subframe.

FIG. 4C shows an example of a base frame of data that contains three subframes. The FIG. 4C base frame allocates 1 bit for synchronization and 2 bits for subframe rate definition as described above in connection with FIG. 4A. Additionally, the FIG. 4C base frame allocates 12 bits for excitation, and the 12 excitation bits apply to all three subframes in this base frame. Each of the 3 subframes allocates 5 bits for an energy information field and 8 bits for a spectrum information field.

FIG. 4D shows a base frame of data that contains four subframes. FIG. 4D allocates 1 bit to synchronization and 2 bits to subframe rate, as discussed above in connection with FIG. 4A. FIG. 4D allocates 7 bits to excitation. The excitation field applies to each of the four subframes contained within this base frame of data. Additionally, a 4-bit field is allocated as a base energy field. The base energy field also applies to each of the four subframes within this base frame of data. Each of the four subframes contains a 2-bit energy difference field and an 8-bit spectrum field. The 2-bit energy difference field is intended to describe a change in energy from the base energy value contained in the base energy field. Alternatively, energy difference fields may describe the change in energy from the energy description of a previous subframe within the base frame of data.

FIG. 4E represents an alternative embodiment to the format shown in FIG. 4A. As discussed above, FIG. 4A allocates only 16 bits to a spectrum field. Using VQ, this 16-bit spectrum field suggests that a 16-bit reference pattern descriptor code and a codebook having less than $2^{16}$ reference patterns are to be employed. The conventional LPC analysis process may generate 10 spectrum coefficients for each subframe. If a codebook contains 65,536 reference patterns and each reference pattern contains ten values, an undesirably large amount of memory may be required for the codebook. Furthermore, an undesirably large processing capability may be required in order to search through such a codebook for a nearest matching pattern in real time. Accordingly, the present invention contemplates the use of an alternative quantization process to VQ process 46c when a slowest subframe rate is selected. Consequently, the format described by FIG. 4E describes 1 bit allocated to synchronization and 2 bits allocated to subframe rate as discussed above in FIG. 4A. However, FIG. 4E allocates only 9 bits to an excitation field and 6 bits to an energy field. In FIG. 4E, the spectrum field requires 36 bits.

Referring back to FIG. 3, process 50 formats data into various base frame formats, as described in FIGS. 4. The base frame rate remains constant and the bit rate remains constant. However, such formats contemplate a variation in subframe rates through the selection of base frame formats. Process 50 applies formatted base frames of data to fixed rate channel 18 at the completion of analysis process 31.

Synthesis process 51 receives base frames of data formatted by process 50 and decompresses this data to synthesize voice data samples. Synthesis process 51 is performed in vocoder 16b (see FIG. 2). It represents the inverse of the above-described analysis process.

In a "get subframe rate" process 52, the subframe rate field, described above in connection with FIGS. 4, from the base frame of data is obtained and output to other processes within synthesis process 51.

An excitation expansion process 54 represents a conventional process which reverses excitation quantization process 38 from analysis process 31. This process operates on data obtained from the excitation field of the base frame. In the preferred embodiment, one excitation field applies to all subframes. Thus, the output from excitation expansion process 54 applies to all subframes contained in a base frame.

An energy expansion process 56 receives the base frame of data, obtains the energy fields, and performs a conventional expansion process to obtain a unique energy value associated with each of the subframes contained within the base frame of data. Accordingly, an independent energy predictor code is provided at the output of energy expansion process 56 for each of the subframes within the base frame of data.

A spectrum expansion process 58 receives the base frame of data and transforms the code contained within the spectrum field into a set of LPC coefficients. Since the present invention contemplates vector quantization, spectrum expansion process 58 contemplates an inverse vector quantization operation for expansion of the quantization caused by spectrum quantization process 42 in analysis process 31. Accordingly, a switching step 60 selects only one of a plurality of expansion tasks 62 to operate upon the spectrum data obtained from the base frame.

Switching step 60 selects VQ task 62a when subframe rate data obtained from the base frame indicates a maximum subframe rate for the base frame of data. VQ task 52 performs an inverse vector quantization operation to obtain an independent set of predictor code spectrum coefficients for each of the subframes within the base frame of data. The inverse vector quantization operation represents a simpler operation than the vector quantization operation. This task resembles a table lookup operation utilizing the same codebook as was used by VQ task 46a in analysis process 31.

Likewise, switch 60 selects VQ task 62b when the subframe rate data from the base frame of data suggests a medium subframe rate within the base frame. Additionally, switch 60 selects task 62c for expansion of a base frame of data that contains only a single subframe.

Although the vector quantization operations utilized in analysis process 31 and the inverse quantization processes utilized by synthesis process 51 may require a large amount of memory for the codebooks utilized therewith, the same memory may be used for both analysis and snythesis processes. Accordingly, when the same or identical vocoders are utilized to transfer data through fixed rate channel 18, codebooks need not be duplicated for synthesis and analysis operations.

An LPC synthesis process 66 obtains predictor coefficient inputs from each of excitation expansion process 54, energy expansion process 56, and spectrum expansion process 58. LPC synthesis process 66 performs a conventional LPC synthesis operation for each of the subframes indicated by process 52. Thus, as discussed above in connection with LPC analysis process 36, LPC synthesis process 66 performs one or more synthesis operations over the base frame of data. The output from LPC synthesis process 66 represents a multiplicity of voice data samples. In the preferred embodiment, LPC synthesis 66 produces 180 samples every 22.5 milliseconds as shown at completion state 68 in FIG. 3.

Accordingly, the present invention utilizes a general purpose vocoder architecture to implement a variable frame rate, constant bit rate vocoder without the use of buffering or feedback schemes to maintain the constant bit rate. Rather, the constant bit rate is established through the use of a constant base frame rate. A subframe rate is modulated by spectral change of an analog voice signal being analyzed. The spectral change identifies whether a given sound resembles a vowel or a consonant.

The present invention is described above with reference to a particular preferred embodiment which facilitates teaching the present invention. Those skilled in the art will recognize that many alternative embodiments also fall within the scope of the present invention. For example, a wide variation in the number of samples per frame, length of base frames, and particular formats of base frames are contemplated within the scope of the present invention. Likewise, a wide variation may occur in the particular vocoder structures utilized to implement the method of the present invention. These and other modifications to the preferred embodiment which are obvious to those skilled in the art are intended to be included within the scope of the present invention.

I claim:

1. A method of operating a vocoder to compress a multiplicity of voice data samples for application to a constant rate channel, said method comprising the steps of:
   selecting one of a plurality of subframe rates;
   analyzing at lest a portion of the samples to produce a predictive code representative of the analyzed samples;
   quantizing the predictive code into a quantized code having a bit length defined by the selected subframe rate and a rate parameter of the constant rate channel; and
   said steps of selecting, analyzing and quantizing being performed at a bit rate of said constant rate channel.

2. A method as claimed in claim 1 additionally comprising the step a base frame of data to be applied to the constant rate channel at a fixed base frame rate and to include information which remains constant throughout the base frame in addition to a quantized code for at least one subframe.

3. A method as claimed in claim 2 additionally comprising the step of repeating said analyzing and quantizing steps when the selected subframe rate permits more than one subframe to occur during a base frame.

4. A method as claimed in claim 1 wherein said selecting step comprises the steps of:
   measuring spectral change occurring between the multiplicity of voice data samples and a prior multiplicity of voice data samples; and
   modulating subframe rate in response to the spectral change.

5. A method as claimed in claim 4 wherein said modulating step comprises the step of increasing subframe rate in response to increasing spectral change.

6. A method as claimed in claim 1 wherein said quantizing step comprises the step of performing a vector quantization of the predictive code.

7. A method as claimed in claim 6 wherein said quantizing step comprises the steps of:
   making first and second vector quantization codebooks available for searching;
   choosing only one of the first and second vector quantization codebooks in response to said selecting step;
   searching within the chosen one from said choosing step of the first and second vector quantization codebooks for a nearest matching reference pattern to the predective code; and
   retrieving a reference pattern descriptor code which uniquely describes the nearest matching reference pattern.

8. A method as claimed in claim 7 wherein said making step comprises the step of populating the first vector quantization codebook with a quantity of reference patterns that differs from the quantity of reference patterns that populate the second vector quantization codebook so that a first reference pattern descriptor code retrievable from the first codebook for the predective code is described utilizing a different number of bits than describes a second reference pattern descriptor code retrievable from the second codebook for the predective code.

9. A method as claimed in claim 7 wherein said analyzing step performs a linear predictive coding of the multiplicity of voice data samples to generate excitation, energy, and spectrum data, and said searching step comprises the step of transforming the spectrum data into an N-bit code wherein the chosen codebook contains no more than $2^N$ unique reference patterns.

10. A method of operating a vocoder to decompress a base frame of data which represents a multiplicity of voice data samples and which is received from a constant rate channel, said method comprising the steps of:
    obtaining information describing one of a plurality of subframe rates from the constant rate base frame of data;
    separating the base frame of data into a least one subframe of data in response to the subframe rate from said obtaining step;
    expanding each subframe of data from said separating step into an independent predictive code;
    synthesizing the multiplicity of voice data samples from the predictive code for each subframe; and
    said steps of obtaining, separating, expanding and synthesizing being performed at a bit rate of said constant rate channel.

11. A method as claimed in claim 10 wherein said expanding step comprises the step of performing an inverse vector quantization of each subframe of data.

12. A method as claimed in claim 11 wherein said expanding step comprises the steps of:
    making first and second vector quantization codebooks available for the inverse vector quantization operations;
    choosing only one of the first and second vector quantization codebooks in response to the subframe rate from said obtaining step;
    operating with the chosen one from said choosing step of the first and second vector quantization codebooks to generate reference patterns that uniquely match the predictive code for each subframe of data.

13. A method as claimed in claim 12 wherein said making step comprises the step of populating the first vector quantization codebook with a quantity of reference patterns that differs from the quantity of reference patterns that populate the second vector quantization codebook so that a first reference pattern descriptor code utilized with the first vector quantization codebook is described utilizing a different number of bits than describes a second reference pattern descriptor code utilized with the second codebook.

14. A method as claimed in claim 12 wherein the chosen codebook from said choosing step contains no more than $2^N$ reference patterns, wherein the predictive code describes excitation, energy, and spectrum data, wherein said synthesizing step performs a linear predictive coding of the predictive code to generate the multiplicity of voice data samples, and said operating step comprises the step of transforming only an N-bit portion of the subframe of data into the spectrum data portion of the predictive code.

15. A method of operating a vocoder to compress a multiplicity of voice data samples for application to a fixed rate channel, said method comprising the steps of:

measuring spectral change occurring between the multiplicity of voice data samples and a prior multiplicity of voice data samples;

modulating a subframe rate in response to the spectral change so that increasing spectral change causes increasing subframe rate;

performing a linear predictive coding of at least a portion of the multiplicity of voice data samples to generate excitation, energy and spectrum data;

making first and second vector quantization codebooks available for searching;

choosing one of the first and second vector quantization codebooks in response to the subframe rate of said modulating step;

searching within only the one codebook chosen in said choosing step for a nearest matching reference pattern to the spectrum data of said performing step; and retrieving a reference pattern descriptor code which uniquely describes the nearest matching reference pattern, wherein the reference pattern descriptor code contains N bits and the one codebook chosen in said choosing step contains less than $2^N$ unique reference patterns.

16. A method as claimed in claim 15 additionally comprising the step of repeating said performing, searching, and retrieving steps when the subframe rate of said modulating step permits more than one subframe to occur during a base frame.

* * * * *

UNITED STATES PATENT AND TRADEMARK OFFICE
CERTIFICATE OF CORRECTION

PATENT NO. : 4,852,179

DATED : July 25, 1989

INVENTOR(S) : Bruce A. Fette

It is certified that error appears in the above-identified patent and that said Letters Patent is hereby corrected as shown below:

In column 11, claim 2, line 35, after the word "step" insert --of establishing--.

Signed and Sealed this

Twenty-ninth Day of May, 1990

Attest:

HARRY F. MANBECK, JR.

*Attesting Officer*      *Commissioner of Patents and Trademarks*